United States Patent
Cardellino et al.

(10) Patent No.: US 6,284,086 B1
(45) Date of Patent: Sep. 4, 2001

(54) APPARATUS AND METHOD FOR ATTACHING A MICROELECTRONIC DEVICE TO A CARRIER USING A PHOTO INITIATED ANISOTROPIC CONDUCTIVE ADHESIVE

(75) Inventors: Terri Cardellino, Chandler; Michael Richards, Phoenix, both of AZ (US)

(73) Assignee: Three - Five Systems, Inc., Tempe, AZ (US)

( * ) Notice: Subject to any disclaimer, the term of this patent is extended or adjusted under 35 U.S.C. 154(b) by 0 days.

(21) Appl. No.: 09/368,552

(22) Filed: Aug. 5, 1999

(51) Int. Cl.$^7$ .................................................. B32B 31/28
(52) U.S. Cl. ......................... 156/273.7; 156/275.3; 156/275.5; 156/275.7; 29/832; 29/831; 349/150; 257/783
(58) Field of Search ............................ 156/272.2, 272.8, 156/273.7, 275.3, 275.5, 275.7; 29/831, 832; 349/150; 257/778, 783; 361/767; 174/257, 259, 88 R, 94 R

(56) References Cited

U.S. PATENT DOCUMENTS

| | | | |
|---|---|---|---|
| 4,811,081 | * 3/1989 | Lyden | 257/783 |
| 5,744,557 | * 4/1998 | McCormick et al. | 526/171 |
| 5,796,050 | * 8/1998 | Campbell | 156/275.3 |
| 5,852,067 | 12/1998 | Sukejima . | |

FOREIGN PATENT DOCUMENTS 42 00 492 C 2    6/1995   (DE) .

OTHER PUBLICATIONS

*A New Chippackaging Method using Windowless Flip–TAB Laser Connection on Flex Substrate* (Proceedings of 1995 Int'l Flip Chip, BGA, TAB and Advanced Packaging Symposium).

\* cited by examiner

*Primary Examiner*—Michael W. Ball
*Assistant Examiner*—Michael A. Tolin
(74) *Attorney, Agent, or Firm*—John D. Titus; Gallagher & Kennedy, P.A.

(57) ABSTRACT

A very low stress attachment method for attaching a microelectronic device to a flexible substrate comprises use of a photo initiated anisotropic conductive adhesive, preferably an infrared photo initiated anisotropic paste, which can be applied to the bonding terminals of a microelectronic device. The flex circuit is then aligned with the corresponding pads on the device. The flex circuit is then biased against the microelectronic device and the infrared photo initiated anisotropic adhesive is exposed to infrared light by means of a dual purpose light guide that presses against the back side of the polyimide flex circuit and simultaneously receives and guides light energy from an Nd: YAG laser to the back side of the polyimide flex circuit. Light energy from the laser passes through the polyimide substrate and between the circuit tracks of the flex circuit to excite the photo initiator of the photo initiated ACA material, thereby causing it to cure. Preferably the ACA material is a dual cure epoxy such that the photo initiator is required only to begin the polymerization process and a secondary (low-temperature thermal or preferably cationic) polymerization carries the cure through the bulk of the material.

10 Claims, 4 Drawing Sheets

APPARATUS AND METHOD FOR ATTACHING A MICROELECTRONIC DEVICE TO A CARRIER USING A PHOTO INITIATED ANISOTROPIC CONDUCTIVE ADHESIVE

INTRODUCTION

The present invention relates to electronic circuit packages and more particularly to a direct chip attachment (DCA) method incorporating anisotropic conductive adhesives.

Increasing circuit element density in integrated circuits as well as the increasing number of addressable cells in current generation Liquid Crystal Displays, and the requisite increase in input/output (I/O) terminals of these and other current generation microelectronic devices has caused the electronics industry to move away from traditional peripheral wire bonding between the microelectronic device and its mounting substrate (e.g. chip carrier, circuit card, flex circuit, etc.) to interconnection schemes capable of supporting greater densities of I/Os per chip such as tape automated bonding (TAB) and various "flip chip" bonding methods. In the flip chip process, a two-dimensional array of solder wettable terminals are provided on the bottom surface of the microelectronic device. A mirror image array of solder wettable terminals are provided on the mounting substrate. Solder bumps are deposited on the solder wettable terminals on the chip. The chip is then turned upside down (hence the name flip chip) with the solder bumps on the chip aligned with the terminals on the substrate and the chip is joined to the substrate by the reflow of the solder bumps. An underfill of epoxy is then provided to secure the chip to the substrate and to limit moisture infiltration. The flip chip process accommodates very high I/O density because the entire bottom surface of the chip is made available for I/O connections. The solder bumps used in the flip chip process ordinarily comprise a low tin solder alloy having a relatively high melting point. Low tin alloy solders have superior thermal fatigue characteristics and the high melting point reduces the risk that subsequent soldering operations on the substrate will loosen the flip chip bond. The relatively high joining temperature (between about 340° C. to about 380° C.), however, precludes the use of direct chip attachment methods with temperature sensitive components such as Liquid Crystal Displays (LCD's).

A prior art method for adapting the flip chip bonding approach to polyimide flex circuit substrates is the Fiber Push Connection (FPC) method illustrated in FIG. 1. In the Fiber Push Connection method, an Nd: YAG laser having a wavelength of 1,060 nanometers is directed through a glass fiber contacting the back side of the polyimide flex circuit. Since the transparency of polyimide is about 88% at the wavelength of the Nd: YAG laser, the majority of the laser energy passes through the flex circuit and is absorbed by the copper leads on the flex circuit. The copper leads are heated by the laser energy until the solder bump on the flip chip melts and reflows, thereby establishing a connection between the flex circuit lead and the terminal on the flip chip. A fairly complex feedback control system including an infrared detector must be used in order to avoid overheating the copper lead and causing it to delaminate from the polyimide backing.

For high impedance tolerant devices such as liquid crystal displays, a highly cost effective alternative to flip chip attachment has been the use of anisotropic conductive adhesives (ACA's) to bond the display chip to the substrate. In a conventional anisotropic conductive adhesive bonding process, as shown in FIG. 2, an anisotropic adhesive comprising conductive particles suspended in an insulating matrix is applied between the bonding pads of a microelectronic device and the substrate. The microelectronic element is then pressed against the substrate until the gap between the bonding pads of the element and substrate is less than the diameter of the conductive particles. Some of the conductive particles are trapped between the bond pads of the microelectronic element and the bond pads of the substrate, thereby completing the circuit. If the pitch of the bond pads and the diameter and density of the conductive particles are properly controlled, circuits will be properly made between opposing bond pads without shorts forming between adjacent pads.

Standard ACA attachment methods comprise thermal compression bonding, in which the microelectronic device and substrate are pressed together, typically at a force of at least one-half ton per square inch of bump area and typically about five tons per square inch of bump area at a temperature typically above 200° C. Although the bond temperatures used to cure ACA materials are significantly lower than the temperatures necessary for conventional flip chip bonding, even for moderately large LCD cells, residual stresses caused by the difference in thermal coefficient of expansion (TCE) between the cell and the substrate will distort the cell after the bonding process is completed. The distortion caused by the residual stresses will manifest itself as non-uniform color fidelity and other undesirable optical distortions across the surface of the display cell.

Current flip chip on glass (FCOG) processes utilize an ACA material that is initiated by ultraviolet light transmitted through the glass substrate. The UV curable ACA does not require exposure to high temperatures and therefore results in little or no residual stress between the chip and its glass substrate. Unfortunately, UV curable ACA materials must be used with glass substrates which are transparent to the ultraviolet light. They are not compatible with flex circuitry because the polyimide material used in flex circuitry is almost totally opaque to UV light. Although fiber push connection would be a feasible alternative for producing a low stress attachment that is compatible with polyimide flex circuit substrates, as discussed hereinbefore, the FPC method requires a costly and complex feedback loop to prevent overheating the circuit traces with the high laser power utilized in the FPC method. Moreover, FPC requires a special blackening treatment to be applied to the copper traces to cause them to absorb the energy from the Nd: YAG laser. An untreated copper trace reflects about 97% of the energy from the Nd: YAG laser, and therefore would not heat quickly enough to melt the solder bumps before the polyimide backing was damaged. The special blackening treatment also adds to the cost of the FPC method. Accordingly, what is needed is a method for bonding a microelectronic element to a flexible substrate using a low temperature ACA material that can be photo initiated by a wavelength of light that can pass through the polyimide flex circuit substrate.

SUMMARY OF THE INVENTION

The present invention comprises a very low stress attachment method in which a microelectronic device is attached to a flexible substrate by a photo initiated anisotropic conductive adhesive. In a preferred embodiment of a method of attaching a microelectronic device to a substrate in accordance with the present invention, an infrared photo initiated anisotropic paste is applied to the bonding terminals of a microelectronic device. The flex circuit is then aligned with the corresponding pads on the device. The flex circuit is then biased against the microelectronic device and the infrared photo initiated anisotropic adhesive is exposed to infrared light by means of a dual purpose light guide that presses against the back side of the polyimide flex circuit and simultaneously receives and guides light energy from an Nd: YAG laser to the back side of the polyimide flex circuit. Light energy from the laser passes through the polyimide substrate and between the circuit tracks of the flex circuit to excite the photo initiator of the photo initiated ACA material, thereby causing it to cure. Preferably the ACA material is a dual cure epoxy such that the photo initiator is required only to begin the polymerization process and a secondary (low-temperature thermal or preferably cationic) polymerization process will carry out through the bulk of the material.

BRIEF DESCRIPTION OF THE DRAWING

The present invention will be better understood from a reading of the following detailed description, taken in conjunction with the accompanying drawing figures in which like references designate like elements and, in which.

DETAILED DESCRIPTION

Figure 1:
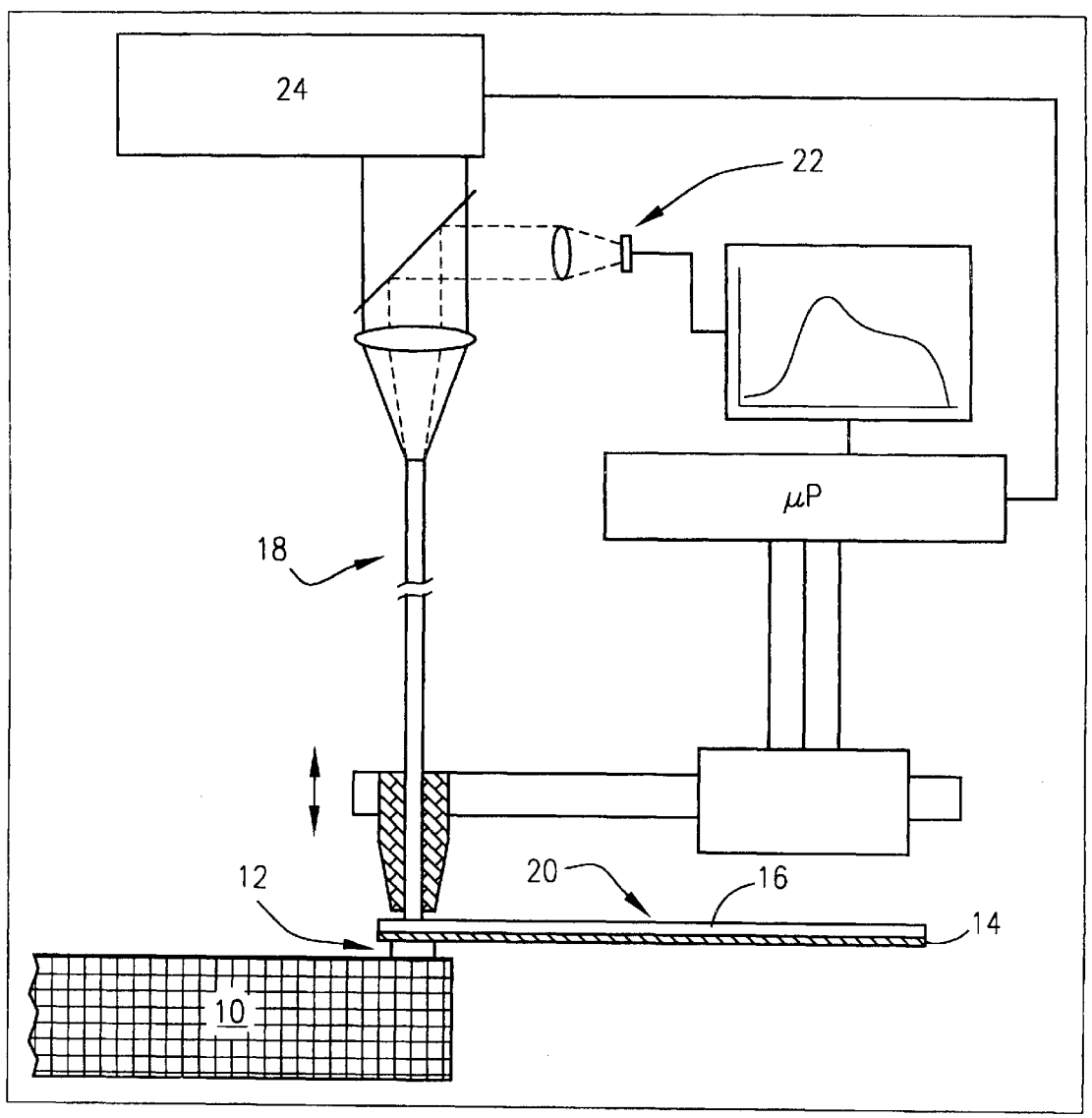
FIG. 1 is a schematic of a prior art fiber push connection flip chip attachment method.

The drawing figures are intended to illustrate the general manner of construction and are not necessarily to scale. In the description and in the claims the terms left, right, front and back and the like are used for descriptive purposes. However, it is understood that the embodiment of the invention described herein is capable of operation in other orientations than is shown and the terms so used are only for the purpose of describing relative positions and are interchangeable under appropriate circumstances.

FIG. 1 is a schematic of a prior art fiber push connection flip chip attachment method. According to the prior art FPC method, a flip chip 10 is placed with the solder bumped terminals 12 in contact with the plurality of leads 14 of a polyimide flex circuit 16. A glass fiber light guide 18 is brought in contact with the back side 20 of flex circuit 16 thereby compressing the junction between lead 14 and solder bump terminal 12. A coherent light source comprising an Nd: YAG laser 24 having a wavelength of 1,060 nanometers is shown into the opposite end of the glass fiber light guide 18 such that the laser energy is directed to the back side of lead 14 proximal solder bump terminal 12. Since the polyimide backing of the flex circuit 16 is approximately 88% transparent to light at the wavelength of the Nd: YAG laser, substantially all of the laser energy is transmitted to the lead 14. The absorption of an unplated copper lead 14 is only about 7% at the wavelength of the Nd: YAG laser. Accordingly, in order to increase the absorption efficiency of the copper leads so that the leads heat quickly enough to melt the solder ball before the polyimide substrate is damaged by the laser, the copper tracks of a flex circuit intended to be used with the FPC connection laser attachment process must be blackened with a tin oxide plating. The temperature of the junction being heated by the FPC laser also must be controlled by a feedback loop consisting of an infrared detector that monitors the infrared signature of the back side of the lead being heated. The output of the infrared detector 22 is then fed into a computer program which modulates the output power of the Nd: YAG laser so as to maintain a controlled temperature. Because of the variability in the absorption quality of the materials and the fact that the absorption quality of the materials varies with temperature, the feedback control unit is necessary to avoid overheating and delaminating the lead 14 from the flex circuit 16.

Although the fiber push connection method renders flip chip attachment of microelectronic devices to flex circuitry feasible, the method has several drawbacks. First, because of the high power density involved, the fiber push connection bonding method must be carried out seriatim, one connection at a time, with the average dwell time per connection being on the order of 40 milliseconds. Accordingly, the throughput of a fiber push connection attachment method is limited. Moreover, the infrared feedback loop necessary to prevent the high power laser from destroying the substrate is a highly sophisticated and costly feature.

Figure 2A:
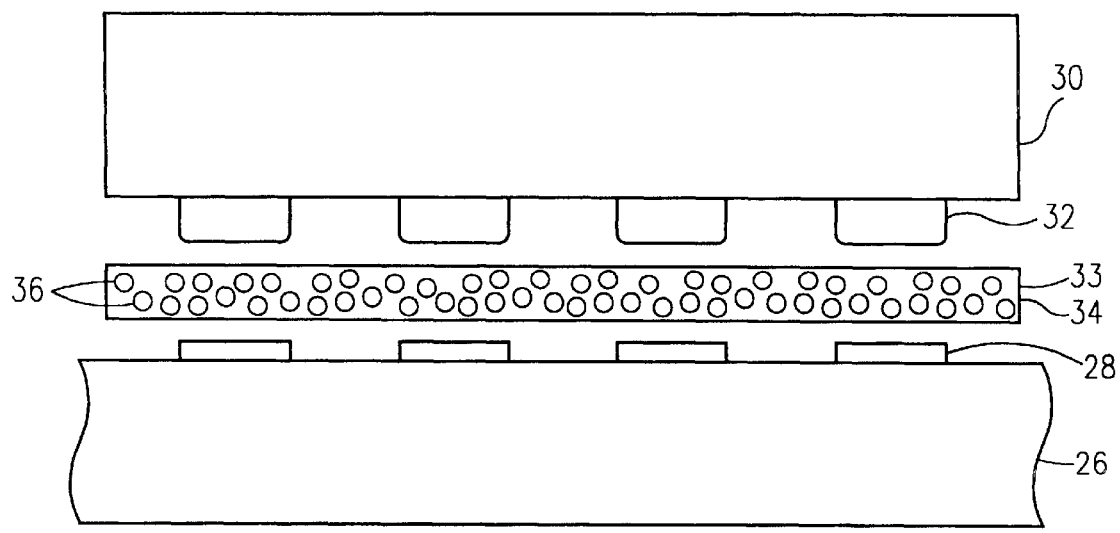
FIG. 2A is a schematic representation of a prior art anisotropic conductive adhesive bonding process prior to the microelectronic device coming into contact with the substrate.
Figure 2B:
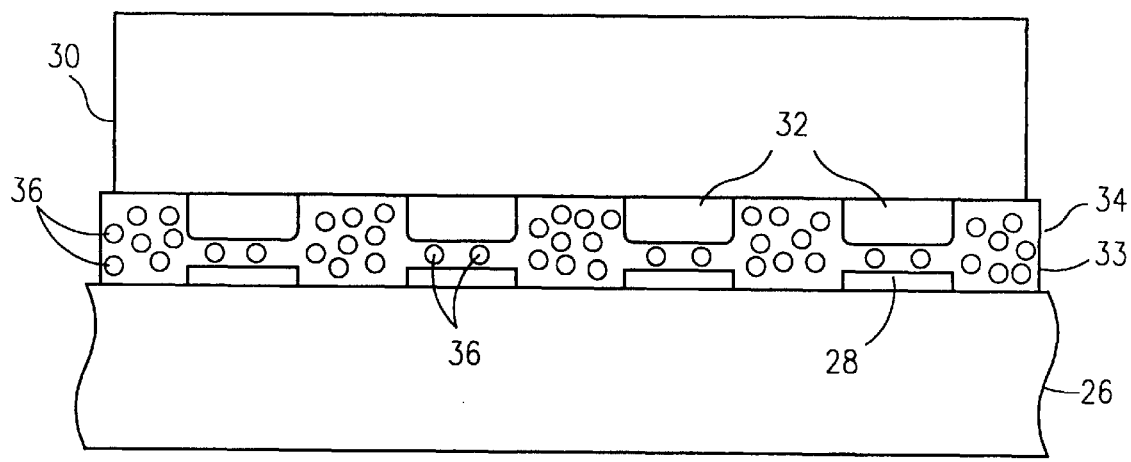
FIG. 2B is a schematic representation of a prior art anisotropic conductive adhesive bonding process after the microelectronic device has come into contact with the substrate.

Another prior art attachment method is shown in FIGS. 2A and 2B. Referring to FIG. 2A, a portion of substrate 26 is shown with an array of contact pads 28 formed thereon (e.g. by standard techniques). The microelectronic device 30 carries an array of raised pads or bumps 32 which may be gold bumps, copper bumps or solder bumps or other terminals as are standard in the art. The ACA material 33 comprises a dielectric polymer matrix 34 in which are suspended a plurality of conductive particles 36. In a typical interconnection process e.g. flip chip on glass (FCOG), the glass substrate is on the order of 1 to 3 millimeters thick and the bonding areas 28 are portions of a metalization pattern such as indium tin oxide, or aluminum. The pitch of these pads according to the current state of the art is on the order of 50 to 200 micrometers and the spacing between the pads may be 20 to 50 micrometers. The contact pads 28 are typically gold bumps with dimensions corresponding to the pad array of the substrate in the XY plane, and with a height (Z dimension) of typically 15 to 30 micrometers.

Standard ACA materials are typically epoxies, and the conductive particles are typically gold plated polymer particles. Conventionally, the ACA materials are a B-staged film called an anisotropic conductive film (ACF). The films are generally 10 to 40 micrometers thick and the conductive particles have an average diameter of 3 to 10 micrometers.

The bonding operation is conventional and involves the application of heat to the surfaces being bonded, while pressing the surfaces together. The ACF bonding temperatures are typically above about 200° C. The pressure depends upon the ACF material and usually is above one-half ton per square inch of bump area, typically about five tons per square inch of bump area. As shown in FIG. 2B, after the bonding process has occurred, with the microelectronic device 30 and the substrate 26 thermal compressively bonded, the desired layer of conductive particles is trapped between contact pads 28 and raised pads 32 thereby completing the requisite circuits between the components of microelectronic device 30 and the circuit traces in substrate 26. Control of the particle size and density prevents short circuiting between any of the adjacent contact pads 28 or raised pads 32 hence the conductivity of the ACA material is in the Z-direction only hence the name "anisotropic" conductive adhesive.

As noted previously, thermal compression bonding of ACA materials will result in a residual stress induced by the difference in the thermal coefficient of expansion between the microelectronic device 30 and the substrate 26. For large liquid crystal cells the residual stress will result in unacceptable variations in the cell gap thickness and other defects that manifest themselves as color shift variations across the surface of the cell and other undesirable optical effects. Accordingly, various UV curable photo initiated anisotropic conductive adhesives have been developed for use primarily with FCOG applications. Use of UV curable ACA materials is feasible for FCOG applications because the glass substrate is substantially transparent to wavelengths of light shorter than 380 nanometers. The same adhesives, however, cannot be used for ACA bonding of microelectronic devices to flex circuit materials, because the organic backing material for the flex circuit (typically a polyimide) is virtually opaque to these short wavelengths of light. Accordingly, for low-residual stress mounting of microelectronic devices to flex circuit, resort has been made to use of a slow cure UV initiated ACA material which is activated prior to placement of the liquid crystal display element on the flex circuit. Use of a slow cure ACA material, however, has a deleterious effect on throughput because the devices must be fixtured until the ACA cures. It has been suggested that temperature sensitive microelectronic devices such as LCD's could be advantageously attached to flex circuitry by means of the fiber push connection method. As discussed hereinbefore, however, the fiber push connection adds substantial cost to the assembly process because the devices must be pre-bumped with BGA solder balls, the circuit traces on the flex circuit must be pretreated to produce a blackened finish, and the connections must be made serially with approximately 40 milliseconds dwell time per connection, which adversely affects throughput.

Accordingly, the inventors of the present invention determined that a low stress interconnection between a microelectronic device and a flex circuit could be effected using a ACA material having a photo initiator that is excited by a wavelength of light capable of passing through the polyimide substrate of the flex circuit. The ACA material could then be applied to the microelectronic device, the flex circuit positioned and, in a manner analogous to the fiber push connection method, the ACA material exposed to light at the appropriate wavelength to initiate the photo initiator by means of a laser shown through the back side of the polyimide substrate.

Figure 3:
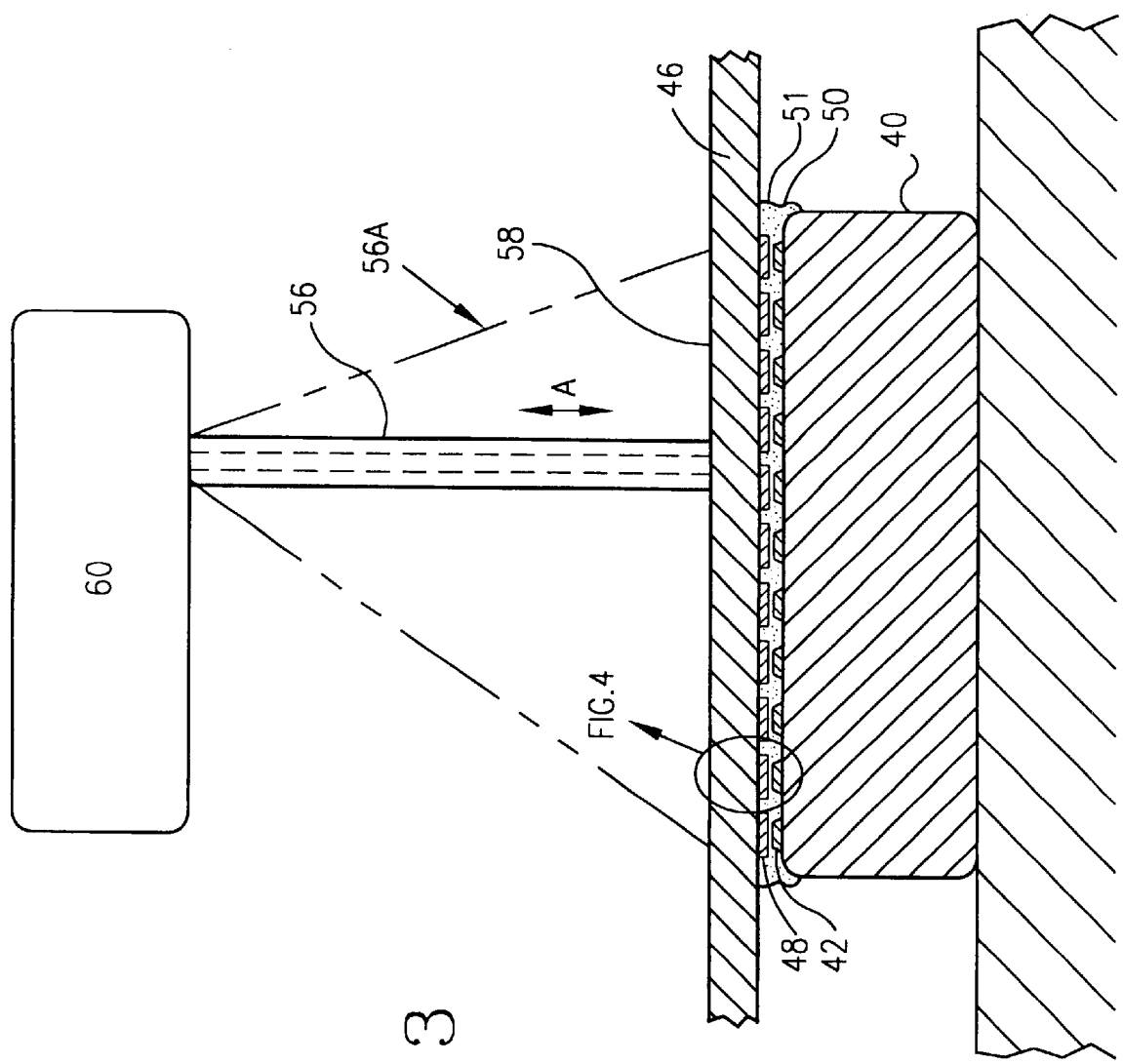
FIG. 3 is a schematic view of an anisotropic conductive adhesive bonding process incorporating features of the present invention.

FIG. 3 is a schematic view illustrating a method of assembling a microelectronic component to a flexible substrate using a photo initiated ACA material in accordance with the present invention. As shown in FIG. 3, microelectronic device 40, which may be an integrated circuit, LCD, microsensor or other device having surface I/O's, comprises a plurality of bonding pads 42 formed on a surface thereof by conventional techniques. A flexible substrate 46 such as a polyimide flex circuit also has formed thereon a plurality of conductive bonding pads 48. An anisotropic conductive material 51 comprising a dielectric 50 suspending a plurality of conductive particles 52 is disposed between microelectronic device 40 and substrate 46 (shown more clearly in FIG. 4). A movable light guide 56, which is capable of reciprocating in the direction indicated by arrow A is pressed against the back side 58 of substrate 46 thereby biasing substrate 46 against microelectronic device 40. An Nd:YAG laser 60 provides a source of infrared radiation at a wavelength of 1,060 nanometers which is guided by movable light guide 56 to the back side 58 of substrate 46. Since the substrate 46, being made of a polyimide material, is substantially transparent to light at a wavelength of 1,060 nanometers, a substantial portion of the light incident to back side to 58 of substrate 46 reaches front surface 62 (FIG. 4) of backing 46 to begin the photo initiation of the ACA matrix 50. As used herein with respect to the carrier substrate, the term "substantially transparent" means that sufficient light energy of the appropriate wavelength passes through the substrate to excite the photo initiator of the ACA material before the light energy absorbed by the substrate has any deleterious effect on the substrate itself (i.e. causes an excessive elevation in temperature, melts, delaminates, or otherwise degrades the substrate). As noted hereinbefore, a polyimide substrate is approximately 88% transparent to infrared light at a wavelength of 1,060 nanometers, however, since the laser energy necessary to excite a photo initiator of a photo initiated ACA material is substantially less than the power necessary to melt and reflow a solder ball, the transmissivity/transparency of the substrate may be substantially less than 88% down to as little as 50% or less within the scope of the invention.

Figure 4:
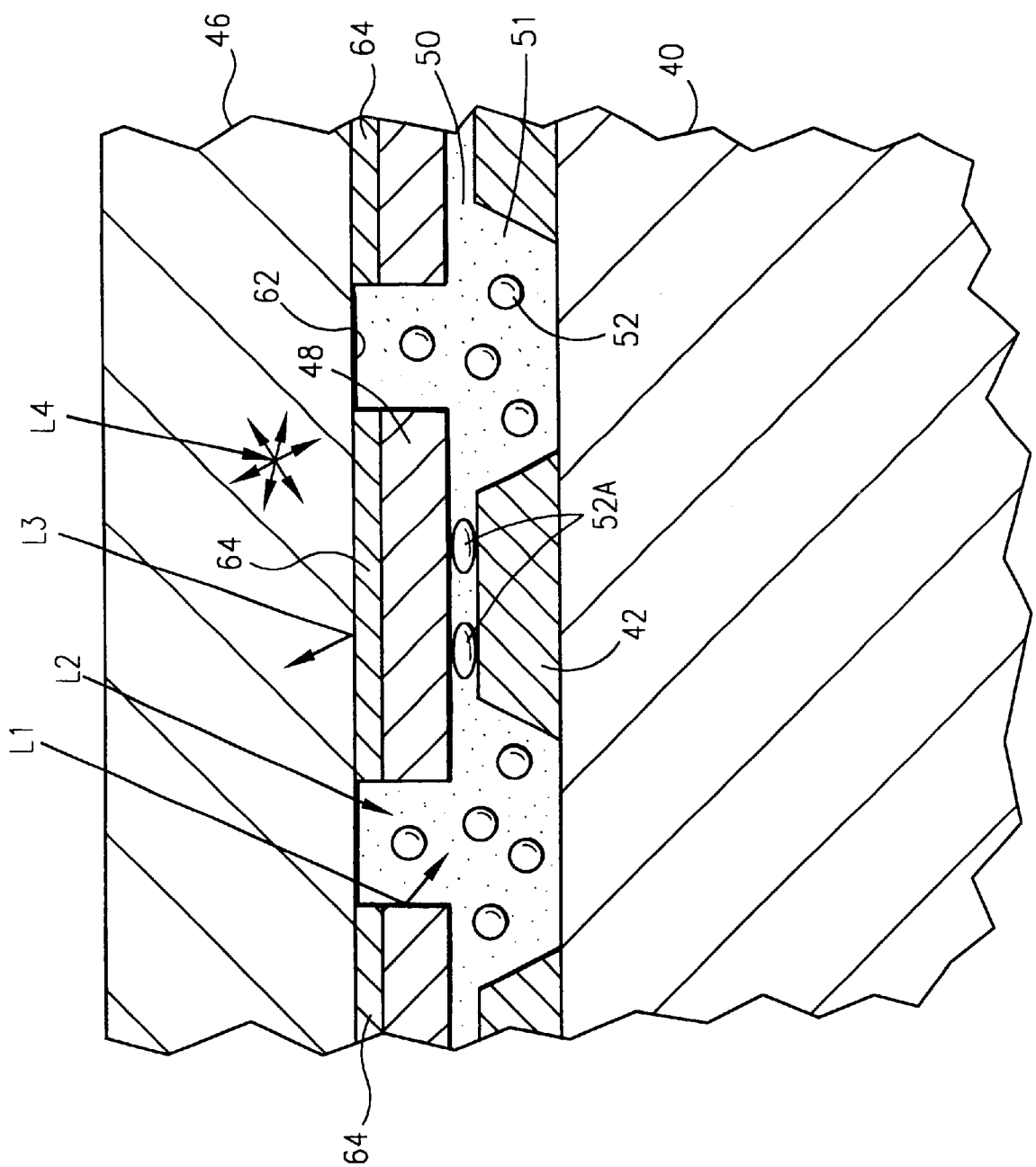
FIG. 4 is an enlarged view of the portion indicated in FIG. 3.

As shown more fully in FIG. 4 as light energy, represented by rays L1, L2, L3 and L4 passes into substrate 46, a portion of the light energy entering substrate 46 as represented by light ray L1 passes completely through substrate 46 entering the matrix 50 of the ACA material, is reflected by one of raised pads 48 or one of the plurality of circuit traces 64 that interconnect raised pads 48 to the external circuitry (not shown) and is absorbed by the photo initiator of the matrix 50 of the ACA material. A certain portion of the incident light represented by ray L2 passes completely through substrate 46 and enters and is absorbed by matrix 50 of the ACA material without reflecting from any surface. A certain portion of the light represented by ray L3 passes completely through the substrate 46 and is reflected back toward the source by the back surface of circuit trace 64, and a certain portion of the light represented by ray L4 is scattered and/or absorbed by substrate 46 itself.

As shown in FIG. 4, the photo initiated polymer matrix 50 of the ACA material 51 completely fills the void between substrate 46 and microelectronic component 40 thereby securing the microelectronic device 40 to the substrate 46 over a large bond area and simultaneously seals the contact pads from the environment. Some of the plurality of the conductive particles 52 shown as particles 52A are trapped between conductive pads 42 of the microelectronic device 40 and the bonding pads 48 of the substrate 46 in conventional fashion to create a Z-axis circuit between microelectronic device 40 and circuit traces 64 of substrate 46.

As shown in FIG. 3, although a thin fiber light guide such as light guide 56 may be used for seriatim initiation of the photo initiated ACA material 51, because the power necessary to excite the photo initiator of a photo initiated ACA is substantially less than the power level necessary to melt and reflow a solder ball, it is not necessary to initiate the ACA material seriatim. Instead, photo initiation may be achieved using a light guide in the shape of a wedge (as shown in phantom lines as 56A), or a rectangular bar or other broad area light guide for compressing and photo initiating the ACA material simultaneously. Moreover, because of the low power involved, it is not necessary to provide a feedback loop to control the laser power.

Preferably the ACA material is a dual cure adhesive that will cure throughout the bulk of the material in response to photoinitiation, such as a material that uses a combination of photoinitiation and low temperature thermal polymerization or, preferably a material that uses a photoinitiator to initiate a cationic polymerization. A material illustrative of a suitable photo initiated matrix for use in an infrared photo initiated ACA material is a near infrared adhesive containing a near infrared absorbing cationic as disclosed in U.S. Pat. No. 5,852,067 which is incorporated herein by reference. Preferably the ACA material comprises conventional conductive particles or conductive plated polymer particles suspended in an acrylated polymer matrix capable of dark curing in response to the excitation of the near infrared excitable photo initiator. By using a dark curing acrylated matrix, those portions of the ACA material that are shadowed from direct radiation by the circuit traces 64 will nevertheless fully cure. Preferably, the photo initiator is sensitive to near infrared to infrared light of a wavelength from 650 to approximately 10,600 nanometers from light sources such as a Quartz halogen lamp, an Nd: YAG laser (1,060 nanometers wavelength) or a $CO_2$ laser (wavelength 10,600 nanometers) such that the incident light energy passes through a polyimide substrate. The near infrared cationic dye may preferably include the near infrared absorbing cationic dye disclosed in Japanese Patent Application Laid Open No. 111402/91 (European Patent Publication No. 438123) and may be used in combination with a boron based sensitizer. The above-referenced cationic dye is excited by light energy at wavelengths in the region from 650 to 1,500 nanometers. When used in conjunction with an Nd: YAG laser having a wavelength of 1,060 nanometers, the above-referenced combination produces a photo initiated deep curing polymer matrix which may be used with conventional conductive fillers to produce an ACA paste capable of being photo initiated with light at a wavelength to which the polyimide backing of conventional flex circuitry is 88% transparent. Although the low stress packaging approach disclosed herein is particularly suited to large liquid crystal cells which are highly sensitive to thermally induced residual stress, the foregoing attachment method may be advantageously utilized in any electronic application in which semi-conductor components or other components are to be attached to a flexible carrier.

Although certain preferred embodiments and methods have been disclosed herein, it will be apparent from the foregoing disclosure to those skilled in the art that variations and modifications of such embodiments and methods may be made without departing from the spirit and scope of the invention. Accordingly, it is intended that the invention shall be limited only to the extent required by the appended claims and the rules and principles of applicable law.

What is claimed is:

1. A method of attaching a microelectronic device to a carrier, the carrier comprising a flexible substrate having a top side and a bottom side, the top side of the carrier including a plurality of conductive traces disposed thereon, the flexible substrate being substantially transparent to light energy having wavelengths within a first wavelength range, the microelectronic device having a plurality of conductive pads on a surface thereof, the method comprising:

providing a plurality of conductive bonding pads on the top side of the carrier, selected ones of the conductive bonding pads being electrically interconnected to selected ones of the plurality of conductive traces disposed on the top side of the carrier;

applying an anisotropic conductive adhesive between the conductive pads of the microelectronic device and the conductive bonding pads on the carrier, the anisotropic conductive adhesive comprising a photo initiated adhesive;

applying pressure to seat the microelectronic device on the carrier and to complete the electrical connections between the conductive pads and the bonding pads through the anisotropic conductive adhesive; and exposing the back side of the carrier to a source of light comprising a wavelength within the first wavelength range such that the light waves within the first wavelength range are substantially transmitted through the flexible substrate to initiate the curing process of the anisotropic conductive adhesive, wherein light from the light source is guided to the back side of the carrier by means of a light guide, said light guide being substantially transparent to light energy having wavelengths within the first wavelength range.

2. The method of claim 1, wherein:

the step of applying pressure to seat the microelectronic device is carried out by pressing the light guide against the back side of the carrier.

3. The method of claim 1, wherein:

said first wavelength range consists of near infrared to infrared wavelengths of at least 650 nanometers.

4. The method of claim 1, wherein said first wavelength range consists of infrared wavelengths of at least 1,060 nanometers.

5. The method of claim 1, wherein said first wavelength range consists of wavelengths in the range of from 650 to 10,600 nanometers.

6. A method of attaching a microelectronic device to a carrier, the carrier comprising a flexible substrate having a top side and a bottom side, the top side of the carrier including a plurality of conductive traces disposed thereon, the flexible substrate being substantially transparent to light energy having wavelengths within a first wavelength range, the microelectronic device having a plurality of conductive pads on a surface thereof, the method comprising:

providing a plurality of conductive bonding pads on the top side of the carrier, selected ones of the conductive bonding pads being electrically interconnected to selected ones of the plurality of conductive traces disposed on the top side of the carrier;

applying an anisotropic conductive adhesive between the conductive pads of the semiconductor device and the conductive bonding pads on the carrier, the anisotropic conductive adhesive comprising a photo initiated adhesive;

applying pressure to seat the microelectronic device on the carrier and to complete the electrical connections between the conductive pads and the bonding pads through the anisotropic conductive adhesive; and exposing the back side of the carrier to a source of light comprising a wavelength within the first wavelength range such that the light waves within the first wavelength range are substantially transmitted through the flexible substrate to initiate the curing process of the anisotropic conductive adhesive, wherein the step of exposing the back side of the carrier to a source of light is carried out by means of an infrared laser having a wavelength of at least 1,060 nanometers.

7. The method of claim 6, wherein:

the infrared laser has a wavelength in the range of from 1,060 to 10,600 nanometers.

8. The method of claim 6, wherein:

light from the light source is guided to the back side of the carrier by means of a light guide, said light guide being substantially transparent to light energy having wavelengths within the first wavelength range.

9. The method of claim 8, wherein:
the step of applying pressure to seat the microelectronic device is carried out by pressing the light guide against the back side of the carrier.

10. A method of attaching a microelectronic device to a carrier, the carrier comprising a flexible substrate having a top side and a bottom side, the top side of the carrier including a plurality of conductive traces disposed thereon, the flexible substrate being substantially transparent to light energy having wavelengths within a first wavelength range, the microelectronic device having a plurality of conductive pads on a surface thereof, the method comprising:

providing a plurality of conductive bonding pads on the top side of the carrier, selected ones of the conductive bonding pads being electrically interconnected to selected ones of the plurality of conductive traces disposed on the top side of the carrier;

applying an anisotropic conductive adhesive between the conductive pads of the semiconductor device and the conductive bonding pads on the carrier, the anisotropic conductive adhesive comprising a photo initiated adhesive;

applying pressure to seat the microelectronic device on the carrier and to complete the electrical connections between the conductive pads and the bonding pads through the anisotropic conductive adhesive; and exposing the back side of the carrier to a source of light comprising a wavelength within the first wavelength range such that the light waves within the first wavelength range are substantially transmitted through the flexible substrate to initiate the curing process of the anisotropic conductive adhesive, wherein the step of exposing the back side of the carrier to a source of light is carried out by means of an nd:YAG laser.

* * * * *